United States Patent [19]

Yoshimura

[11] Patent Number: 5,446,675
[45] Date of Patent: Aug. 29, 1995

[54] DEVELOPING METHOD AND APPARATUS OF HIERARCHICAL GRAPHIC DATA FOR USE IN A SEMICONDUCTOR INTEGRATED CIRCUIT

[75] Inventor: Terumi Yoshimura, Kasugai, Japan

[73] Assignees: Fujitsu Limited; Fujitsu VLSI Limited, Aichi, Japan

[21] Appl. No.: 189,033

[22] Filed: Jan. 31, 1994

[30] Foreign Application Priority Data

Mar. 19, 1993 [JP] Japan .................................. 5-060772

[51] Int. Cl.[6] ............................................. G06F 17/50
[52] U.S. Cl. ...................................... 364/489; 364/488
[58] Field of Search ................. 364/488, 489, 490, 491

[56] References Cited

U.S. PATENT DOCUMENTS 5,231,590 7/1993 Kumar et al. ........................ 364/491
5,301,318 4/1994 Mittal ................................... 364/489
5,384,710 1/1995 Lam et al. ............................ 364/489
5,396,435 3/1995 Ginetti ................................. 364/489

Primary Examiner—Vincent N. Trans
Attorney, Agent, or Firm—Armstrong, Westerman Hattori, McLeland and Naughton

[57] ABSTRACT

A system and apparatus for using hierarchically organized data to design semiconductor integrated circuits is herein disclosed wherein a plurality of macros and circuit logic cells containing circuit component parameter information are cross referenced using two types of pointers. An intermediate table 27 in a logic development file 5 stores information relating to a general controlling macro "CHIP", user defined macros A, B, and also stores the parameter information relating to every macro. A cell table 28 stores circuit cells C, D, E, F. The macro "CHIP" A, B, and cells, and the macro and cell are cross referenced by multi-table and an identical table pointer.

4 Claims, 8 Drawing Sheets

DEVELOPING METHOD AND APPARATUS OF HIERARCHICAL GRAPHIC DATA FOR USE IN A SEMICONDUCTOR INTEGRATED CIRCUIT

BACKGROUND OF THE INVENTION

1. Field of the invention

The present invention relates generally to a method and an apparatus wherein hierarchical graphic data is employed for designing a semiconductor integrated circuit. More particularly, the invention relates to a method for managing logical information in a front-end tool, which is employed in a computer aided design apparatus (CAD) for designing a large scale integrated (LSI) circuit.

2. Description of the Related Art

Generally, when designing an LSI circuit by means of a CAD system, a computer program is formed from a net list of circuit parameters which describes the design of the circuit. The net list most generally utilizes a plurality of subprograms or macros corresponding to models of functional circuit elements or individual circuit cells (hereinafter referred to as a cell). Usually, the first design operation is to specify in the net list one or more macros or cells used in the circuit's construction. Next, each of the macros is divided into minute macros and the operation for designing each of the minute macros is carried out.

The overall of use of such a net list, as conventionally used in semiconductor design, is illustrated as shown in the block diagram of FIG. 6. Generally such net lists are created and defined according to the particular design parameters assigned to the various subcircuits and circuit elements (macros and cells, respectively) included in a particular semiconductor. Consequently, a net list is defined in part by the names of the macros or cells that are employed. Each of the macros is in turn defined by the particular input/output pins employed by the semiconductor and by the names of the nets that couple to the pins.

Table 1 shows an example of a hierarchical net list. In this particular net list, the controlling macro is defined by the name "CHIP". The "CHIP" is further defined by minute or user defined macros A, B as well as cell C. Each of the user defined macros and cell represent individual circuits or circuit elements respectively, and are defined in the net list to achieve a particular circuit function.

TABLE 1

NAME : CHIP ;
INPUTS : . 14 ;
OUTPUTS : . 15 , . 16 , . 17 ;
TYPES ;
   MACRO A : A ;
   MACRO B : B ;
   CELL C : C ;
ENDTYPES ;
NETS ;
   001 : . 14 , A. 9 ;
   002 : A. 10 , B. 11 ; C. 7 ;
   003 : C. 8 , . 15 ;
   004 : B. 12 , . 16 ;
   005 : B. 13 , . 17 ;
ENDNETS ;
ENDNAME ;
(MACRO A)
   NAME : A ;
   INPUTS : . 9 ;
   OUTPUTS : . 10 ;
   TYPES ;

TABLE 1-continued

CELL D : D ;
   ENDTYPES ;
   NETS ;
     001 : . 9 , D. 1 ;
     002 : . 10 , D. 2 ;
   ENDNETS ;
   ENDNAME ;
(MACRO B)
   NAME : B ;
   INPUTS : . 11 ;
   OUTPUTS : . 12 ;
   TYPES ;
     CELL E : E ;
     CELL F : F ;
   ENDTYPES ;
   NETS ;
     001 : . 11 , E. 3 , F. 5 ;
     002 : E. 4 , . 12 ;
     003 : F. 6 , . 13 ;
   ENDNETS ;
   ENDNAME ;

A specific logic file for every macro is then created for use in the hierarchical net list. These logic files 12, are used to generate a corresponding logic development file 13 representing the final desired semiconductor chip design or layout. Should the design results happen to be unsatisfactory to the designer, the logic development file can be decompiled and revised in redeveloped net list 20.

FIG. 7 is illustrative of the layout of circuit elements and fundamental logic cells on a semiconductor chip 14, designed using a hierarchical net list like that illustrated in table 1. A logic development file 15 corresponding to the layout of semiconductor chip 14 file is illustrated by FIG. 8, and comprises a top macro table 16, cell table 17, cell pin table 18, and net table 19.

The controlling macro table 16 stores the information relating to the chip specified as "CHIP" and includes such parameters as the number of the input/output pins and the output level with respect to that of the input level, etc. The cell table 17 stores the information relating to the cells C, D, E, F as chosen by the designer. The cell D is a cell that is employed in the user's macro A. The cells E, F are cells that are employed in the user's macro B. The cell C is coupled with the chip "CHIP" via a multi-table pointer 16a. The cells C through F are serially coupled via pointers 17a through 17c and are defined without regards to any previous or more general macros or data. The cell pin table 18 stores the information relating to the input/output pins D1, D2, E3, E4, F5, F6, C7, C8, CH14, CH15, CH16, CH17 also as chosen by the designer. The CH14, CH15, CH16, CH17 are input/output pins disposed in the semiconductor chip 14. In the net list, CH thereof is indicated by an independent ".". The net table 19 stores the information relating to the nets N1 through N5 that couple with the corresponding input/output pins, respectively.

Such conventionally developed net lists, as described above, are not designed having a hierarchical structure. Rather, they utilize a single dimensional structure having cells C, D, E, F that include data describing only a single element or circuit function. None include any predevelopment based upon any intermediate stage, such as user defined macro A or B.

Table 2 illustrates the appearance of a net list 20 decompiled from a logic development file 15. Such a decompiled net list would be desired when, for example, an unsatisfactory design result was obtained from the logic development file 13. From this decompiled net list 20, the design of the semiconductor chip 14 and the overall structure of the logic development file could be altered.

TABLE 2

```
NAME : CHIP ;
INPUTS : . 14 ;
OUTPUTS : . 15 , . 16 , . 17 ;
TYPES ;
    CELL D : D ;
    CELL E : E ;
    CELL F : F ;
ENDTYPES ;
NETS ;
    001 : . 14 , D. 1 ;
    002 : D. 2 , C. 7 ; E. 3 , F. 5 ;
    003 : C.8 , . 15 ;
    004 : E. 4 , . 16 ;
    005 : F. 6 , . 17 ;
ENDNETS ;
ENDNAME ;
```

Thus in one sense, the conventional logic development file is itself an independent macro having no connection or relation to any of a myriad of user defined macros which may be available for use in any given semiconductor design.

Generally, conventional logic development files include only the cell level units defined at the most basic model level. This is to be contrasted with the hierarchical net list as shown in FIG. 9 where, for example, the I/O (i.e., input/output) macros 22, 23, and 24 are formed using the cells G and H; cells G and I; and cells G and J respectively.

However, if a net list is developed using conventional techniques, only the cells G, H, I, J would be utilized in creating a logic development file, without the benefits of macros 22 through 24. The immediate disadvantage of this occasions is the absence, in the logic development file itself, of any tangentially relevant circuit information, such as for example, industry standards for evaluating the operability of various components used in constructing semiconductors. Conventionally, such standards must be stored in files distinct from the logic development file. Therefore, for example, standard semiconductor components comprising many individual circuit cells can be evaluated by appropriate and corresponding evaluative parameters existing in a user defined macro unit. However, these parameters usually only stored in a different file from the logic development file.

FIG. 10 shows an examined standard file 25 that indicates parameters utilized during a circuit evaluation with respect to the I/O (input/output) of a user defined macro. For example, standard parameter data respecting a pin X in the semiconductor chip 21 as shown in FIG. 9 is to be taken out from the file 25. The blocks labeled 101, 102, 103 are test execution circuits, respectively. In this case, the cell H coupled with the cell G is searched from the developed net list through the net. A rather difficult method is executed for taking out a standard value "201" from the file 25, based on the combination of the cells G, H.

Further, in the conventional developing logic file, a macro X defined by the cells K, L as shown in FIG. 11 is unavailable for use in circuit evaluation. Only delay values relating to the cells K, L, as indicated by the parenthesized numbers, and the net lists exist. Consequently, the circuit simulation should be carried out by determining the delay values of the cells K, L and the net, respectively.

Conventionally, additional circuit parameters must be added to the logic development file in order to achieve a simple execution of the circuit's simulation. This makes it difficult for the designer when he desires to change or alter the schematic description of the net list. An additional difficulty is that such alterations to the design must be preformed without changing the overall desired characteristics of the LSI circuit.

Conventionally, to confirm whether an altered or changed net list produces equivalent overall LSI circuit results, the logic development file is often decompiled into the net list 20, as shown in FIG. 6. However, if the developing logic file 15 as shown in FIG. 8 is returned into the net list, only the ichnographically developed net list is presented for review without the benefit of allowing intermediate stages such a macro creation to be examined.

In the past, it has often been difficult to compare a redeveloped net list as shown in FIG. 6 with the hierarchical net list shown in Table 1. With the increase integration of circuit components in todays semiconductors, it is increasingly difficult for circuit designers to confirm that overall semiconductor design characteristics remain unchanged upon adding or deleting circuit components from the net list.

Furthermore, a conventional logic development file has a unidimensional structure that is entirely formed with very basic logic cell units such as AND or OR gates. With such basic units, the net list description and the data which must be made available to evaluate the net list data becomes excessively large. Consequently, as the number of files increases, more hardware is required to handle the increase, the manufacturing cost increases, and, as the access time to the required files increases, operational speed of the CAD design program decreases. Moreover, as the operation for managing conventional design system becomes increasingly complicated, the designer is faced with the additional problem of file designation. Meticulous care must be maintained to properly designate the multiplicity of files needed to preform the circuit design.

SUMMARY OF THE INVENTION

It is therefore an object of the present invention to arrange the organization of data in a logic development file representative of cells arranged on a semiconductor chip by storing macros or cells coupled with various pointers into the developing logic file. To achieve this object, a method and apparatus is proposed using a computer system to assist in the design of a semiconductor circuit wherein a user inputs circuit parameter data to said computer system by an input device for processing by said computer system into a hierarchy of data used to describe the design of the semiconductor, its component parts, and the connections between said component parts. The hierarchy of data is organized according to a net list of circuit data describing the circuit parameters of at least one circuit cell representative of semiconductor component having input and output pins. The circuit cell parameters include information describing the location of said input and output pins. The hierarchy of data is further organized according to a user defined cell macro having data representative of a plurality of circuit cells and the connections made therebetween, and according to a controlling macro comprising data describing said circuit cell and said user defined cell macro as well as the connections made therebetween.

A net list of circuit parameter data is first input into the computer system to produce a plurality of macro logic files corresponding to the number of user defined cell macros defined in said net list. Secondly, a logic development file is produced from said plurality of macro logic files, containing a plurality of data tables wherein a hierarchy of data is arranged by storing circuit parameter information respecting said controlling and user defined macro data in an intermediate table, storing circuit parameter information respecting said circuit cell data in a circuit cell table, storing information respecting the input and output pin locations of said logic cell in a cell pin table, storing information respecting said net list data in a net list table, storing information respecting the input and output pin locations described in said user defined macro in an intermediate pin table, and by cross referencing the information stored in said plurality of tables using an identical table and a multi-table pointer.

The identical table pointer operates to cross reference information stored within each of said intermediate table, the circuit cell table, and said cell pin table. The multi-table pointer operating to cross reference the information stored between said intermediate and circuit cell tables, said circuit cell and cell pin tables, said cell pin and net list tables and said net list and intermediate pin tables. A third step is provided to display the hierarchical relationship created in said logic development file.

BRIEF DESCRIPTION OF THE DRAWINGS

The invention, together with objects and advantages thereof, may best be understood by reference to the following description of the presently preferred embodiments together with the accompanying drawings, in which.

DESCRIPTION OF THE PREFERRED EMBODIMENT

A preferred embodiment of the present invention will now be described referring to FIGS. 1 through 5.

Figure 1:
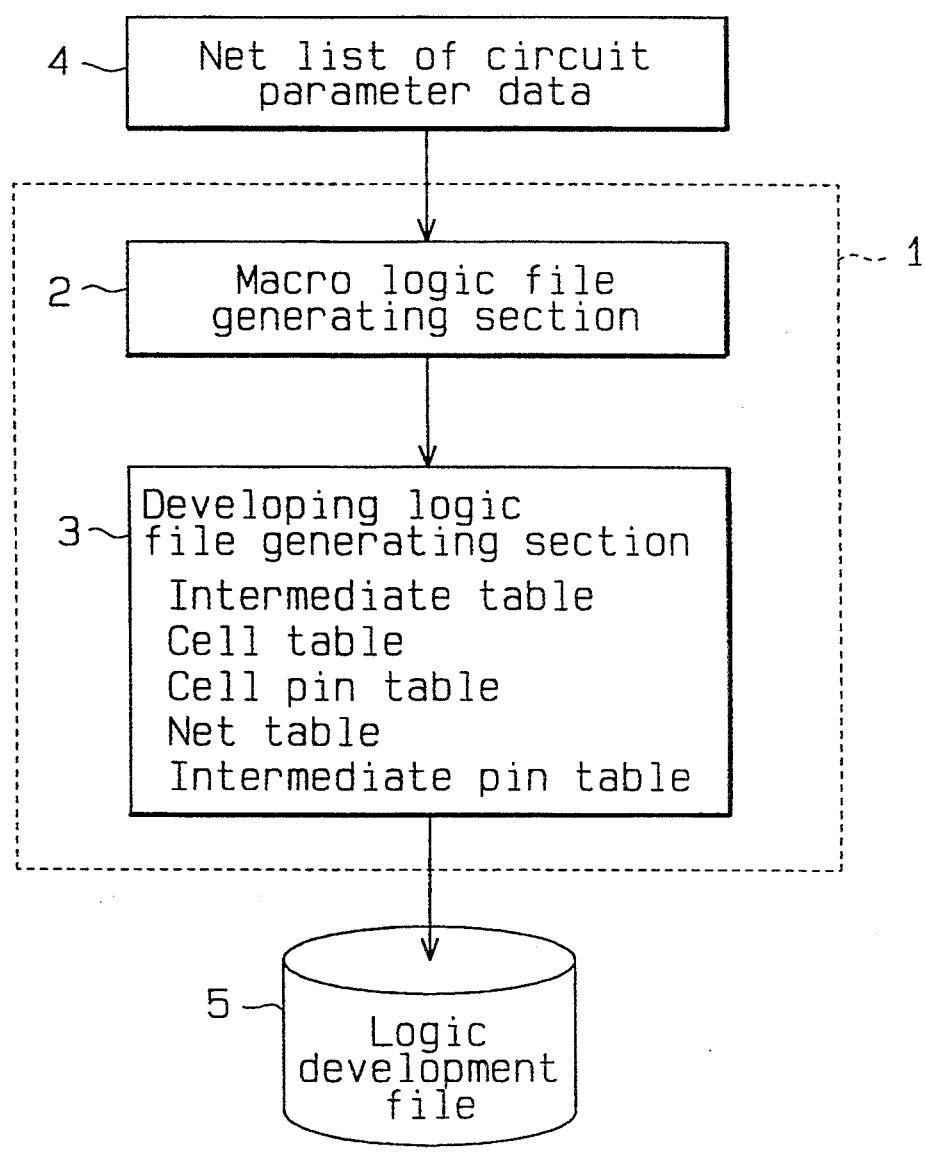
FIG. 1 is a schematic view of a graphical data developing apparatus according to the preferred embodiment of the present invention.

FIG. 1 is a schematic view of a graphic data developing apparatus 1 that is a part of a CAD. The apparatus 1 includes a macro logic file generating section 2 and a developing logic file generating section 3. The macro logic generating section 2 receives as input a net list of circuit parameter data 4 representing a particular circuit design. With this data, the logic generating section generates a logic file for every macro created from the input list 4. For example, if the hierarchical net list as shown in the table 1 is input, logic files of chip "CHIP", and user's macros A, B are created, respectively.

Figure 2:
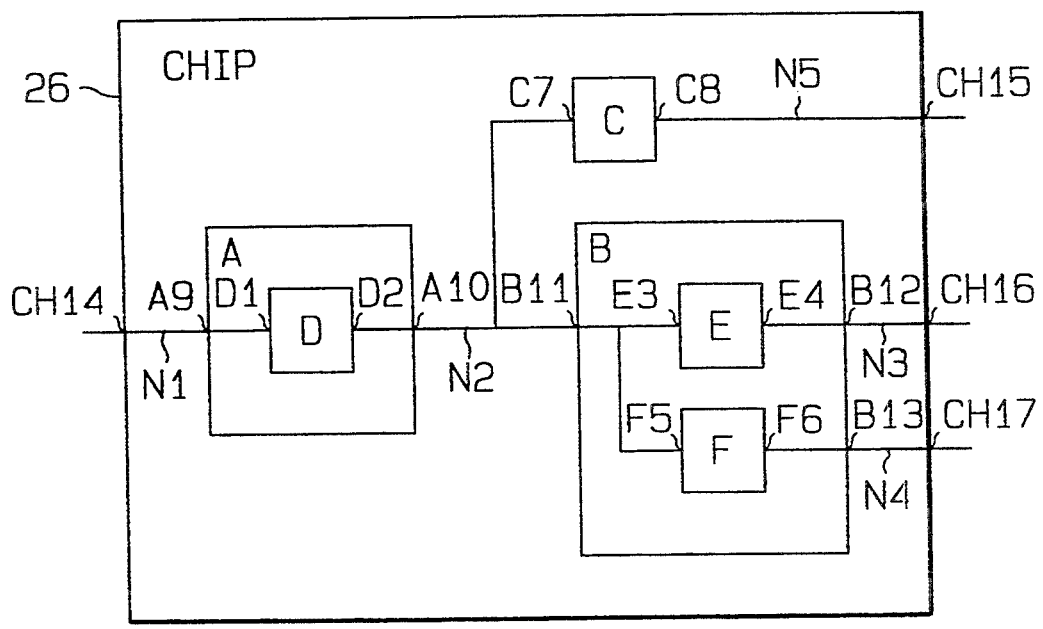
FIG. 2 is an explanatory block diagram in which a hierarchical net list is developed on a semiconductor chip.
Figure 3:
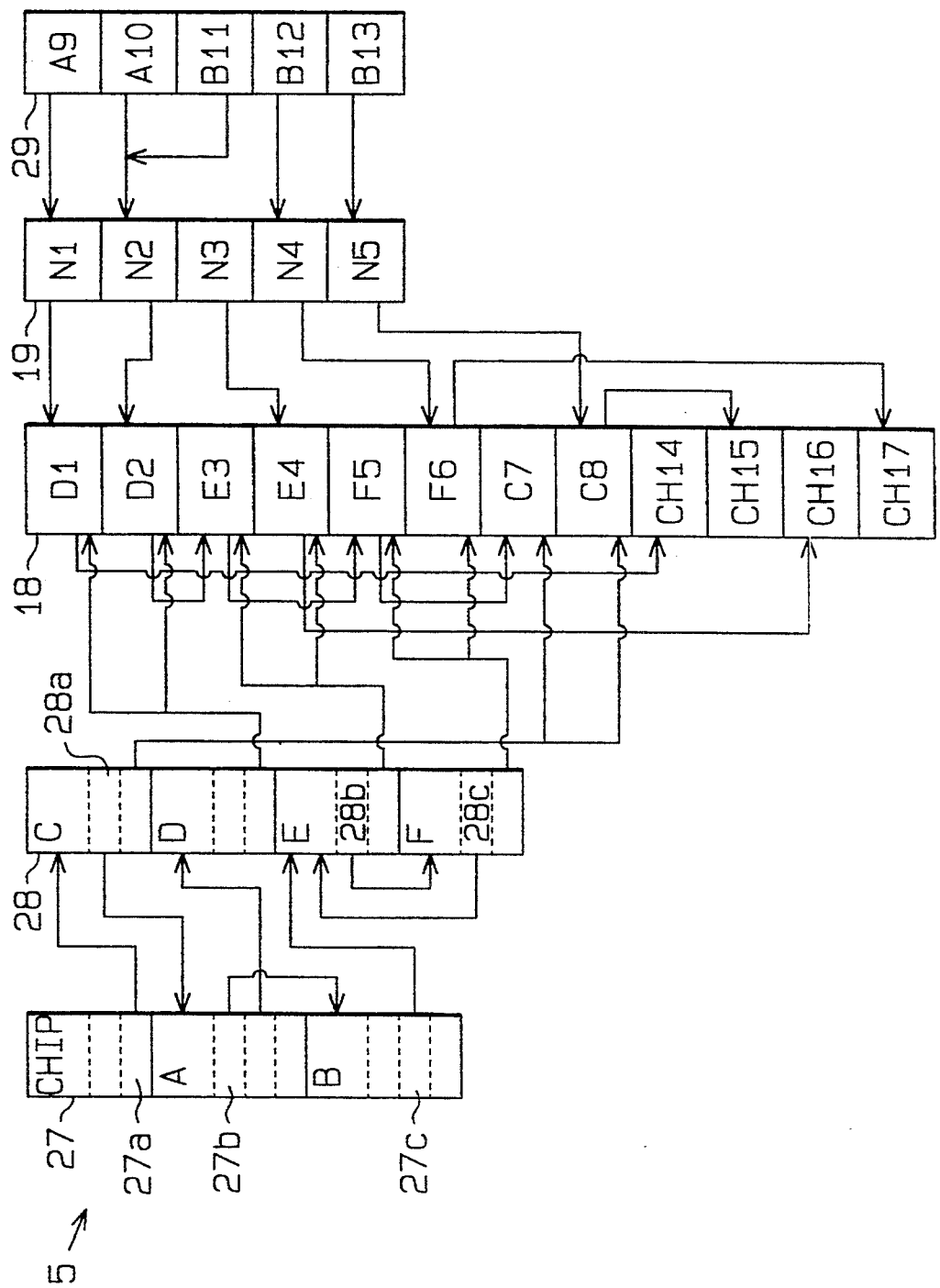
FIG. 3 is an explanatory block diagram showing developing logic files.

The developing section 3 creates a corresponding logic development file 5 by developing every logic file that was generated by the macro section 2, so that the designing of the final semiconductor integrated circuit may be accomplished. FIG. 2 illustrates one example of the layout and design of a semiconductor chip 26 according to this embodiment. FIG. 3 shows the logic development files 5 corresponding to the design illustrated in FIG. 2.

As shown in FIG. 2, the user defined macros A, B and cell C form a top macro "CHIP". A circuit cell D is formed within the user defined macro A, and includes pins A9, A10. The user defined macro B is formed including with circuit cells E, F, and includes pins B11 through B13.

As shown in FIG. 3, an intermediate table 27, circuit cell table 28, cell pin table 18, net list table 19 and intermediate pin table 29 form a logic development file 5. These tables can be stored, for example, in the read only memory of the computer system executing the design program.

The intermediate table 27 stores the information relating to the macro "CHIP" and the user defined macros A, B that are employed. Further, the table 27 stores the information relating to various parameters of every user defined macros, here illustrated as A, B, respectively. The included parametric information, given as only one example of the present invention, includes the evaluative parameters, line codes (or coded line widths), the numbers of fanout and delay values in macro units, etc.

The cell table 28 stores the cells C, D, E, F that are employed. The cell C is a cell employed in the user's macro "CHIP". The cell D is a cell employed in the user defined macro A. The cells E, F are cells that are employed in the user defined macro B.

The macros "CHIP", A, B in the intermediate table 27, cells in the cell table 28, or the macro and cell are coupled to each other by two type of pointers: a multi-table pointer that indicates the relationship between macros and the specific cell and net information stored in various tables in the hierarchical structure, or identical table pointers that indicate cross referenced data representing connected components and related parametric information disposed in the same table. The cell C is coupled with the chip "CHIP" by a multi-table pointer 27a. The user defined macro A is coupled with the cell C by an identical table pointer 28a. The user defined macro B is coupled with the user defined macro A by an identical table pointer 27b. The cell E is coupled with the user defined macro B by a multi-table pointer 27c. The cells E, F are mutually coupled by identical table pointers 28b, 28c. Therefore, the multitable and identical table relationships with respect to each of the macros "CHIP", A, B, can be made eminently clear.

The cell pin table 18 stores the information relating to input/output pins D1, D2, E3, E4, F5, F6, C7, C8, CH14, CH15, CH16, CH17. The CH14, CH15, CH16, CH17 are input/output pins disposed in the semiconductor chip 26. "CH" in the net list is indicated by an independent ".".

The net list table 19 stores the information relating to nets N1 through N5 that are employed to couple the pins. Each of the nets N1 through N5 in the net list table 19 designates the corresponding pins D1, D2, E4, F6, C8 in the cell pin table 18, respectively. Each pin in the cell table 18 further designates the other pin that is linked with itself.

The intermediate pin table 29 stores the information relating to the input/output pins A9, A10, B11, B12, B13 of the user defined macros A, B. The pin A9 designates the net N1. The input/output pins A10, B11 designate the net N2. The pins B12, B13 designate the nets N4, N5, respectively.

Accordingly in this embodiment, the intermediate table 27 in the logic development file 5 stores the information relating to the top macro and each of the user defined macros. The cell table 28 stores the information relating to each of circuit cells. The cell pin table 18 stores the information relating to the input/output pins that are currently employed. The net list table 19 stores the information relating to the nets that couple with the input/output pins. The intermediate pin table 29 stores the information relating to the input/output pins of each user defined macro. The macros, circuit cells and the macro and circuit cell are mutually coupled by multitable pointers or identical table pointers. Therefore, the multi-table and identical table relationships between the macros, and the cells disposed in the tables can be understood at a glance by seeing the pointer structure thereof.

When the logic development file 5 is decompiled based upon this pointer structure, the hierarchical net list as shown in the table 1, and the hierarchical net lists as shown in tables 3, 4 that will be described afterward are created. Therefore, the examination, evaluation, and redevelopment of the net list is a much simpler task compared with previous design systems. As the net list of this created hierarchical structure is compared with the hierarchical net list before developing (i.e., shown in FIG. 1), it is easier to recognize and understand the added circuits and altered circuits and their contents at a glance, such that the operation for checking the logic equivalence thereof becomes simplified. Further, the developing net list as shown in table 3 can be created.

TABLE 3

NAME : CHIP ;
INPUTS : . 14 ;
OUTPUTS : . 15 , . 16 , . 17 ;
TYPES ;
  MACRO A : A ;
  CELL C : C ;
  CELL E : E ;
  CELL F : F ;
ENDTYPES ;
NETS ;
  001 : . 14 , A. 9 ;
  002 : A. 10 , C. 7 , E. 7 , F. 5 ;
  003 : C. 8 , . 15 ;
  004 : E. 4 , . 16 ;
  005 : F. 6 , . 17 ;
ENDNETS ;

TABLE 3-continued

ENDNAME ;
MACRO A
  NAME : A ;
  INPUTS : . 9 ;
  OUTPUTS : . 10 ;
  TYPES ;
    CELL D : D ;
  ENDTYPES ;
  NETS ;
    001 : . 9 , D. 1 ;
    002 : . 10 , D. 2 ;
  ENDNETS ;
ENDNAME ;

TABLE 4

NAME : CHIP ;
INPUTS : . 14 ;
OUTPUTS : . 15 , . 16 , . 17 ;
TYPES ;
  MACRO B : B ;
  CELL C : C ;
  CELL D : D ;
ENDTYPES ;
NETS ;
  001 : . 14 , A. 9 ;
  002 : A. 10 , B. 11 , C. 7 ;
  003 : C. 8 , . 15 ;
  004 : B. 12 , . 16 ;
  005 : B. 13 , . 17 ;
ENDNETS ;
ENDNAME ;
MACRO B
  NAME : B ;
  INPUTS : . 11 ;
  OUTPUTS : . 12 ;
  TYPES ;
    CELL E : E ;
    CELL F : F ;
  ENDTYPES ;
  NETS ;
    001 : . 11 , E. 3 , F. 5 ;
    002 : E. 4 , . 12 ;
    003 : F. 6 , . 13 ;
  ENDNETS ;
ENDNAME ;

Table 3 shows the net list that the user defined macro B has developed, i.e., the user defined macro A has been hierarchized as a net list itself. When only the equivalence of the hierarchical stages around the user defined macro A is to be evaluated, it becomes easier to check the logic equivalency if the user defined macro A is displayed along with the rest of the information contained in the logic development file.

Table 4 shows the net list that the user defined macro A has developed, i.e., the user defined macro B has itself been hierarchized as a net list when only the equivalence of the hierarchical stages around the user defined macro B is to be checked, it becomes easier to check the logic equivalency if the user defined macro B is displayed along with the rest of the information contained in the logic development file.

Figure 4:
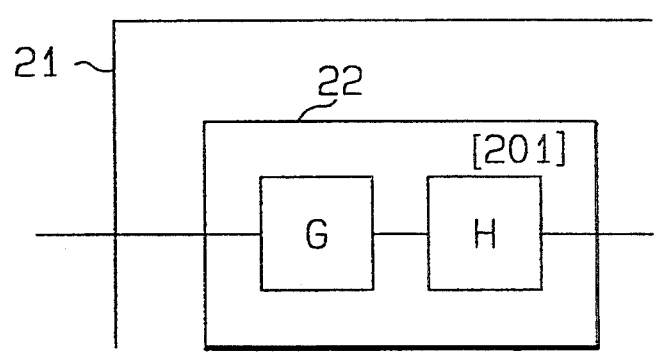
FIG. 4 is an explanatory block diagram showing a current supply test.
Figure 5:
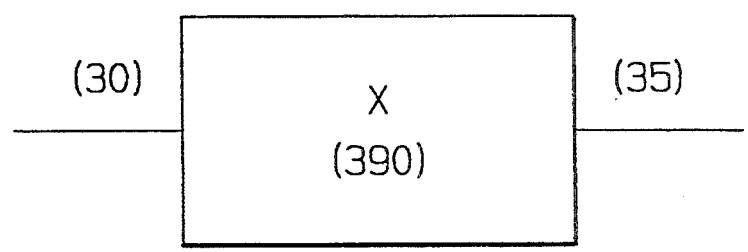
FIG. 5 is an explanatory block diagram showing a circuit data used during circuit designing simulation.
Figure 6:
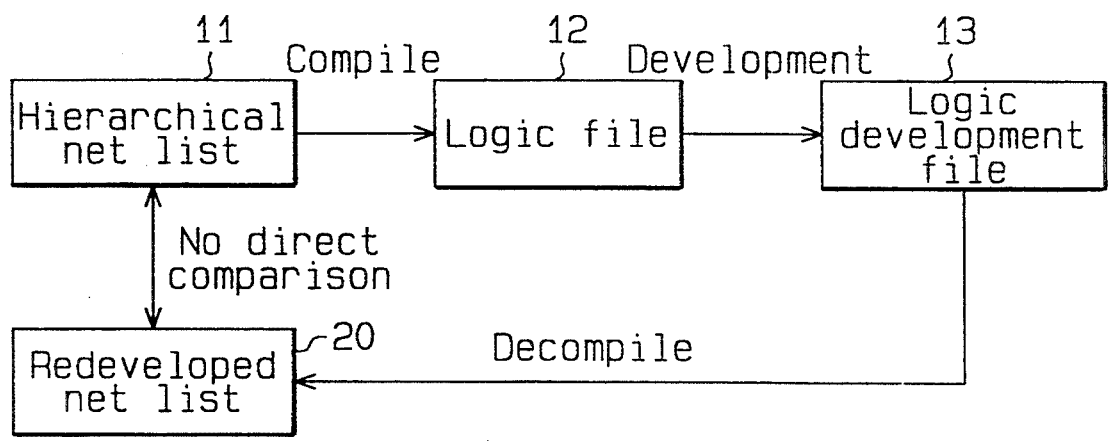
FIG. 6 shows schematic steps for designing a semiconductor integrated circuit.
Figure 7:
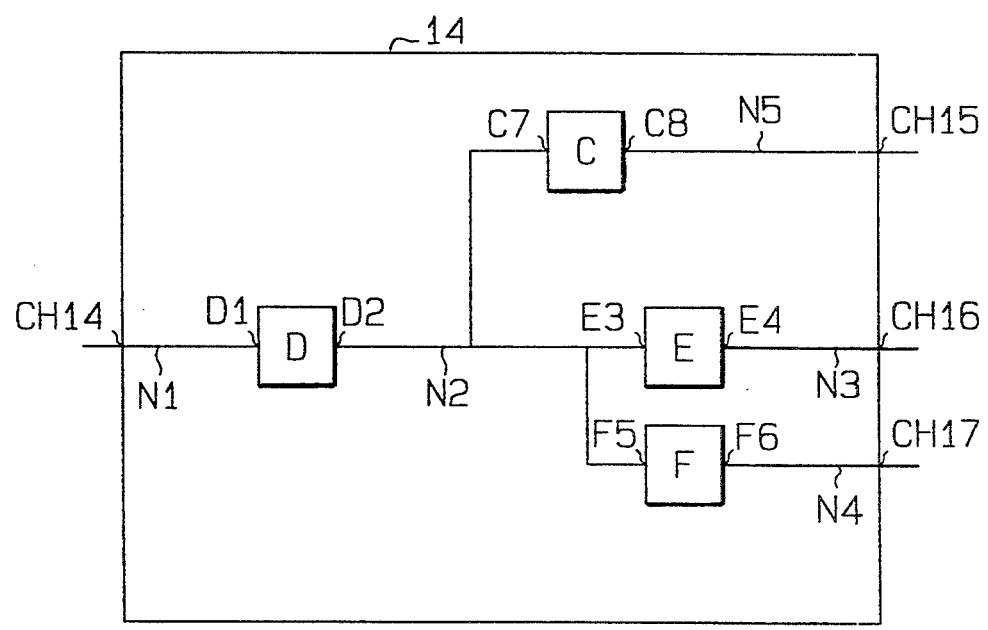
FIG. 7 is an explanatory block diagram in which a hierarchical net list is developed on a semiconductor chip.
Figure 8:
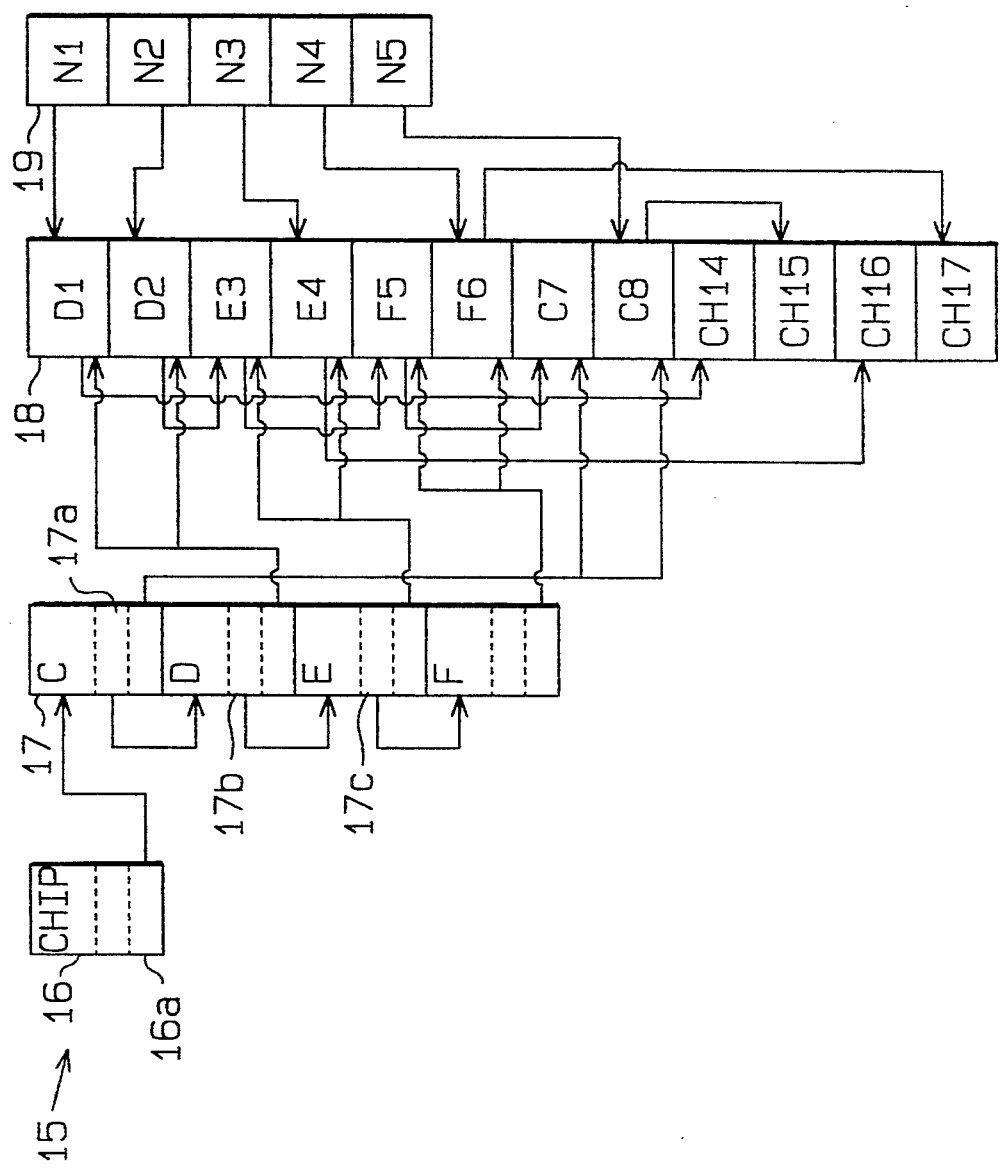
FIG. 8 is an explanatory block diagram showing a conventional developing logic files.
Figure 9:
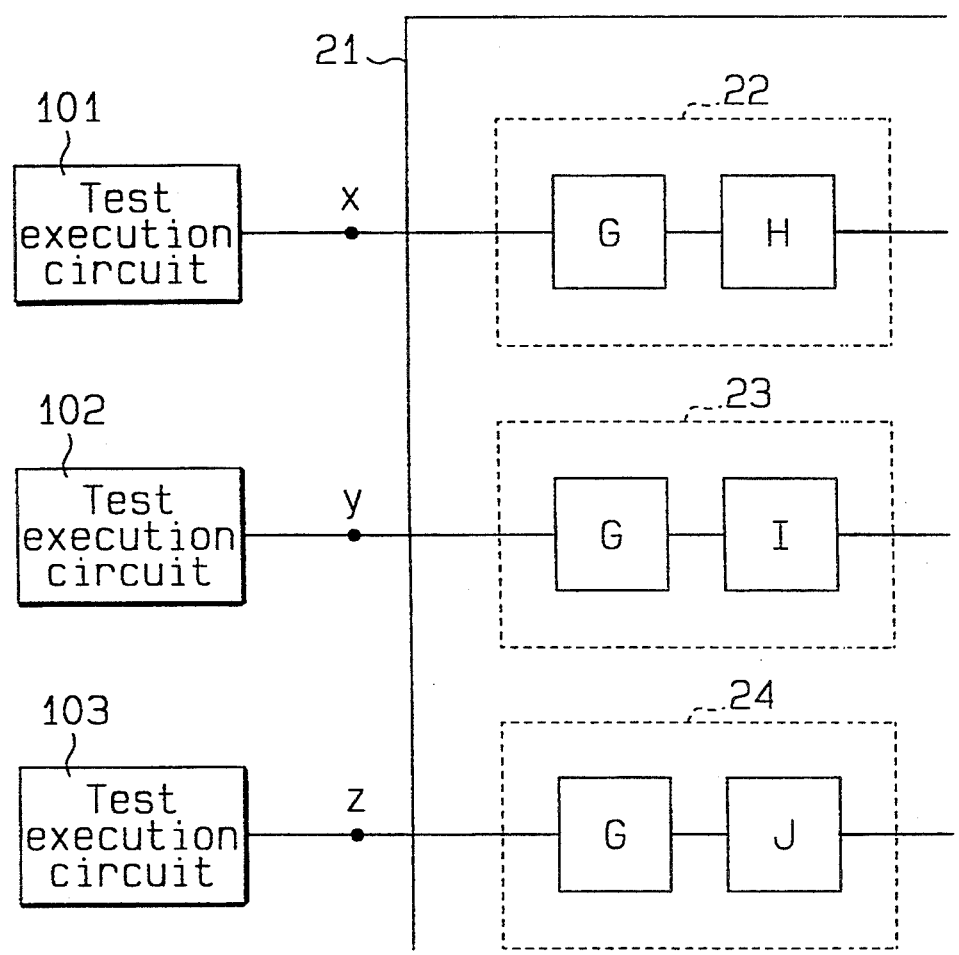
FIG. 9 is an explanatory block diagram showing a conventional current supply test.
Figure 10:
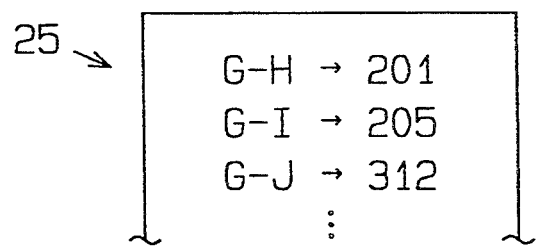
FIG. 10 is a concept diagram of examined standard files.

Referring again now to FIG. 3, the intermediate table 27 stores the information relating to the various parameters of every user defined macro. By storing the information in the described manner, the number of files that store the information relating to the parameters can be controlled so as to minimize design complexity. After an initial design is completed, the information relating to the parameters can be obtained from the intermediate table 27 at a single access, so that informational access time is minimized. Similarly, during the execution of various operations after the developing operation has been accomplished, there is no need to designate the files required for viewing. This greatly simplifies system operation and management. For example, as shown in FIG. 4, a user defined macro 22 formed with the cells G, H can have an examined standard number "201" for reference during a current supply test. This allows the operational time required for carrying out the current supply test to be greatly shortened.

Figure 11:
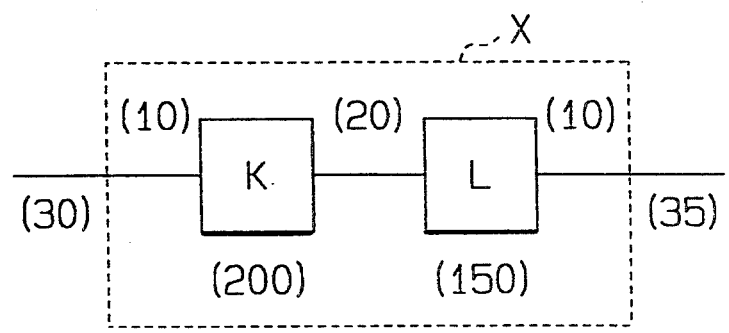
FIG. 11 is an explanatory diagram showing circuit data used during conventional circuit designing simulation.

Further, according to this embodiment, the intermediate table 27 of FIG. 3 can have an intermediate macro that includes delay values in macro units as parameter information relating to each user defined macro. Therefore, the more flexible simulation can be carried out. For example, to carry out the simulation with respect to macro X, a simulation similar to that of FIG. 11 is carried out on each of the cells K, L. After the simulation is completed, the macro X can be treated as a single circuit. However, the parenthesized numbers indicate corresponding delay values of the macros and nets.

What is claimed is:

1. A method of using a computer system to assist in the design of a semiconductor circuit wherein a user inputs circuit parameter data to said computer system by an input device for processing by said computer system into a hierarchy of data used to describe the design of the semiconductor, its component parts, and the connections between said component parts, said hierarchy being organized according to a net list of circuit data input to said computer system describing circuit parameters of at least one circuit cell representative of semiconductor component having input and output pins, said circuit cell parameters including information describing the location of said input and output pins, said hierarchy being further organized according to a user defined cell macro having data representative of a plurality of circuit cells and the connections made therebetween, and according to a controlling macro comprising data describing said circuit cell and said user defined cell macro as well as the connections made therebetween, the method comprising:

a first step of inputting a net list of circuit parameter data into said computer system to produce a plurality of macro logic files corresponding to the number of user defined cell macros defined in said net list;

a second step of producing a logic development file from said plurality of macro logic files, said logic development file containing a plurality of data tables wherein a hierarchy of data is arranged by:

storing circuit parameter information respecting said controlling and user defined macro data in an intermediate table;

storing circuit parameter information respecting said circuit cell data in a circuit cell table;

storing information respecting the input and output pin locations of said logic cell in a cell pin table;

storing information respecting said net list data in a net list table;

storing information respecting the input and output pin locations described in said user defined macro in an intermediate pin table; and cross referencing the information stored in said plurality of tables using an identical table and a multi-table pointer, said identical table pointer operating to cross reference information stored within each of said intermediate table, said circuit cell table, and said cell pin table, said multi-table pointer operating to cross reference the information stored between said intermediate and circuit cell tables, said circuit cell and cell pin tables, said cell pin and net list tables and said net list and intermediate pin tables;

a third step of displaying the hierarchical relationship contained in said logic development file.

2. A method according to claim 1 further including a step of storing various data relating to said user defined macro in said intermediate table for evaluating said semiconductor design.

3. An computer system for assisting in the design of a semiconductor circuit according to a hierarchy of data used to describe the design of the semiconductor, its component parts, and the connections between said component parts, said hierarchy being organized according to a net list of circuit data describing circuit parameters of at least one circuit cell representative of semiconductor component having input and output pins, said circuit cell parameters including information describing the location of said input and output pins, said hierarchy being further organized according to a user defined cell macro having data representative of a plurality of circuit cells and the connections made therebetween, and to a controlling macro comprising data describing said circuit cell and said user defined cell macro as well as the connections made therebetween, the apparatus comprising:

an input means for inputting a net list of circuit parameter data into said computer system;

a first processing means to create a plurality of macro logic files corresponding to the number of user defined cell macros defined in said net list;

a second processing means to create a logic development file from said plurality of macro logic files, said logic development file containing a plurality of data tables;

means for storing circuit parameter information respecting said controlling and said user defined macro data in an intermediate table;

means for storing circuit parameter information respecting said circuit cell data in a circuit cell table;

means for storing information respecting the input and output pin locations of said logic cell in a cell pin table;

means for storing information respecting said net list data in a net list table;

means for storing information respecting the input and output pin locations described in said user defined macro in an intermediate pin table;

means for cross referencing the information stored in said plurality of tables using an identical table and a multi-table pointer, said identical table pointer operating to cross reference information stored within each of said intermediate table, said circuit cell table, and said cell pin table, said multi-table pointer operating to cross reference the information stored between said intermediate and circuit cell tables, said circuit cell and cell pin tables, said cell pin and net list tables and said net list and intermediate pin tables; and means for displaying the hierarchical relationship contained in said logic development file.

4. The apparatus according to claim 3 wherein said means for storing said intermediate table, circuit cell table, cell pin table, net list table and intermediate pin table is a read only memory contained in said computer system.

* * * * *